(12) United States Patent
Huang et al.

(10) Patent No.: US 12,052,534 B2
(45) Date of Patent: Jul. 30, 2024

(54) HEAT DISSIPATION DEVICE

(71) Applicant: AAC Technologies Pte. Ltd., Singapore (SG)

(72) Inventors: Xingzhi Huang, Shenzhen (CN); Lin Liu, Shenzhen (CN); Dijiang Tong, Shenzhen (CN); Zhe Zhang, Shenzhen (CN); Jun Wu, Shenzhen (CN); Zhichen Chen, Shenzhen (CN); Zhaoyu Yin, Shenzhen (CN)

(73) Assignee: AAC TECHNOLOGIES PTE. LTD., Singapore (SG)

( * ) Notice: Subject to any disclaimer, the term of this patent is extended or adjusted under 35 U.S.C. 154(b) by 992 days.

(21) Appl. No.: 16/995,818

(22) Filed: Aug. 18, 2020

(65) Prior Publication Data

US 2021/0029429 A1    Jan. 28, 2021

Related U.S. Application Data

(63) Continuation of application No. PCT/CN2019/097760, filed on Jul. 25, 2019.

(30) Foreign Application Priority Data

Jul. 22, 2019  (CN) .......................... 201921156236.9

(51) Int. Cl.
*H04R 1/02*  (2006.01)
*H04R 7/04*  (2006.01)
*H05K 7/20*  (2006.01)

(52) U.S. Cl.
CPC ................. *H04R 1/02* (2013.01); *H04R 7/04* (2013.01); *H05K 7/205* (2013.01)

(58) Field of Classification Search
CPC .. H05K 7/20909; H05K 7/2039; H05K 7/205; H04R 7/04; H04R 9/022; H04R 9/02; H04R 1/02; F28D 15/0266
See application file for complete search history.

(56) References Cited

U.S. PATENT DOCUMENTS 4,210,778 A * 7/1980 Sakurai ............... F28D 15/0266
                                                   381/349
6,504,720 B2 * 1/2003 Furuya ................ F28D 15/0233
                                                   361/689

(Continued)

FOREIGN PATENT DOCUMENTS

CN        106162391 A  * 11/2016
CN        205847582 U  * 12/2016

OTHER PUBLICATIONS

Translation of CN 106162391 (Year: 2016).*
Translation of CN 205847582 (Year: 2016).*

*Primary Examiner* — Tho V Duong
(74) *Attorney, Agent, or Firm* — W&G Law Group

(57) ABSTRACT

The present invention provides a heat dissipation device having a speaker box, a heating element and a heat conductor. The speaker box includes a housing having a sound outlet hole and a metal embedding member embedded in the housing. The speaker unit includes a diaphragm. The heat conductor is connected to the heating element. In the present invention, the heat conductor transfers the heat generated by the heating element to the metal embedding member, the metal embedding member conducts heat to the outside of the sound outlet hole through the air in the front cavity.

15 Claims, 4 Drawing Sheets

(56) References Cited

U.S. PATENT DOCUMENTS

| | | | |
|---|---|---|---|
| 8,406,450 B2* | 3/2013 | Jiang | F28F 1/32 |
| | | | 381/397 |
| 9,591,387 B2* | 3/2017 | Wirth | F01N 1/065 |
| 2020/0033066 A1* | 1/2020 | Chiriac | F28D 15/025 |

* cited by examiner

HEAT DISSIPATION DEVICE

FIELD OF THE PRESENT DISCLOSURE

The present invention relates to the technical field of heat dissipation, and more particularly to a heat dissipation device using a speaker box.

DESCRIPTION OF RELATED ART

The communication industry has always maintained a high degree of concern about the heat dissipation of heat dissipation devices such as mobile phones, which contain various components that will heat up during operation, generally through the housing of the whole machine, such as metal shells. This will place requirements on the housing material that will affect the circuit layout or antenna performance.

SUMMARY OF THE INVENTION

One of the main objects of the present invention is to provide a heat dissipation device with improved heat dissipation efficiency.

Accordingly, a heat dissipation device is disclosed and comprises:
- a speaker box having n a housing having a sound outlet hole, a speaker unit accommodated in the housing and a metal embedding member embedded in the housing;
- a heating element;
- a heat conductor connected between the speaker box and the heating element; wherein
- the housing encloses to form an accommodation space for accommodating the speaker unit;
- the speaker unit comprises a diaphragm dividing the accommodation space into a front cavity communicated with the outside via the sound outlet hole and a back cavity;
- the housing includes a first through hole communicated with the front cavity and a second through hole communicated with the back cavity;
- the metal embedding member comprises a first reinforcement plate embedded in the housing and covering the first through hole correspondingly, and a second reinforcement plate extending from the first reinforcement plate and covering the second through hole, edges of the metal embedding member are all embedded in the housing;
- the heat conductor is connected with the second reinforcement plate at one end, and connected with the heating element at another end;
- the heat conductor transfers the heat generated by the heating element to the metal embedding member, the metal embedding member conducts the heat to the front cavity and out of the sound outlet hole through the air in the front cavity.

Further, the housing comprises a top wall directly facing and spaced from the diaphragm, a bottom wall opposite to the top wall and a side wall bending and extending from the edge of the top wall toward the bottom wall, and the first through hole and the second through hole are arranged spaced apart in the top wall.

Further, the housing further comprises a support wall extending from the top wall to within the accommodation space, the speaker unit is fixed with the support wall and arranged spaced with respect to the top wall, and the support wall is arranged spaced apart between the front cavity and the back cavity.

Further, the sound outlet hole is formed at the side wall, a front acoustic cavity is formed by a spacing between the diaphragm and the top wall directly facing the diaphragm, the housing is formed with a sound channel connecting the front acoustic cavity and the sound outlet hole, and the front cavity comprises the front acoustic cavity and the sound channel.

Further, the housing further comprises a separation wall separating the sound channel from the back cavity, the separation wall extends from a side of the speaker unit near the sound outlet hole toward the side wall; the separation wall, the top wall and the side wall encloses to form the sound channel.

Further, the first reinforcement plate comprises a main body part directly facing the diaphragm and a bent part bent from the edges of the main body part toward the bottom wall and embedded in the housing, the second reinforcement plate bends and extends from the bent part.

Further, at least a portion of the bent part is embedded in the support wall.

Further, the main body part and the second reinforcement plate are both plate-shaped, and the metal embedding member is integrally formed.

Further, the heat dissipation device further comprising a housing for fixing the speaker box and the heating element, wherein the side wall is attached and fixed correspondingly to the housing, a plurality of sound holes communicated with the sound outlet holes correspondingly are arranged through the housing.

Further, wherein the metal embedding member is plate-shaped and is integrally injection molded with the housing.

Further, the heat conductor is a solid heat conductor.

Further, the heat conductor is a heat conduct tube having a cooling liquid therein.

Further, the heat conductor comprises a contact part superposed on the second reinforcement plate and a connection part extending from one side of the contact part and connected with the heating element.

Further, the contact part is wider than the connection part.

Further, a front projection of the contact part on the second reinforcement plate covers more than two-thirds of the surface of the second reinforcement plate.

BRIEF DESCRIPTION OF THE DRAWINGS

Many aspects of the exemplary embodiment can be better understood with reference to the following drawings. The components in the drawing are not necessarily drawn to scale, the emphasis instead being placed upon clearly illustrating the principles of the present disclosure.

DETAILED DESCRIPTION OF THE EXEMPLARY EMBODIMENT

Figure 1:
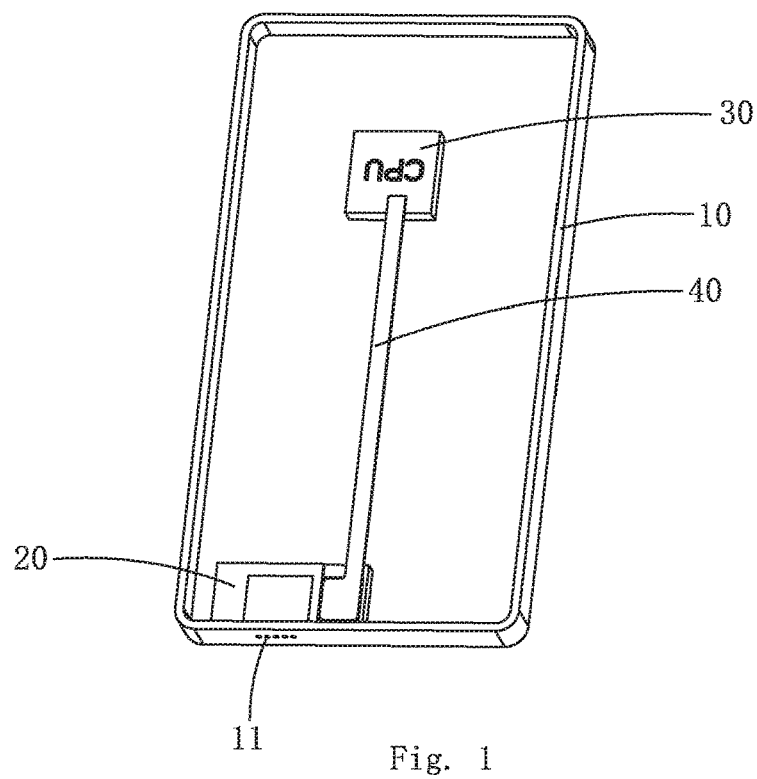
FIG. 1 is an isometric view of an heat dissipation device provided by an embodiment of the present invention.

The present disclosure will hereinafter be described in detail with reference to an exemplary embodiment. To make the technical problems to be solved, technical solutions and beneficial effects of the present disclosure more apparent, the present disclosure is described in further detail together with the figure and the embodiment. It should be understood the specific embodiment described hereby is only to explain the disclosure, not intended to limit the disclosure.

It should be noted that all the directional indications (such as upper, lower, inner, outer, top part, bottom part, etc.) in the embodiment of the present invention are only used to explain the relative position relationship among the components under a certain specific posture (as shown in the accompanying drawings); if such certain specific posture is changed, the directional indication is changed accordingly.

It should also be noted that when an element is referred to as being "fixed" or "disposed" on another element, the element may be directly on the other element or there may be intervening elements at the same time. When an element is called "connected" to another element, it may be directly connected to the other element or there may be intervening elements at the same time.

Referring to FIGS. 1-7, the embodiment of the present invention provides an heat dissipation device, the heat dissipation device comprises a housing 10, a speaker box 20, a heating element 30, and a heat conductor 40 connected between the speaker box 20 and the heating element 30. The speaker box 20, the heating element 30, and the heat conductor 40 are all installed in the housing 10, and heat generated in the heating element 30 can be introduced into the speaker box 20 by the heat conductor 40, then the air is discharged out of the housing 10 continuously by the speaker box 20. The heating element 30 in the embodiment can be the CPU or the battery of the mobile phone or any component in the mobile phone which needs heat dissipation.

Specifically, referring to FIGS. 3-6, the speaker box 20 comprises a housing 21 having sound outlet holes 211, a speaker unit 25 accommodated in the housing 21 and a metal embedding member 26 embedded on the housing 21. The housing 21 encloses to form an accommodation space 22 for accommodating the speaker unit 25, and the sound outlet hole 211 is provided through the housing 21. The speaker unit 25 comprises a diaphragm 251, the diaphragm 251 separates the accommodation space 22 into a front cavity 23 and a back cavity 24; and when conducting heat, the heat conductor 40 transfers the heat generated by the heating element 30 onto the metal embedding member 26. The diaphragm 251, in operation, can generate a high-speed airflow in the area of the front cavity 23, creating an air cooling effect so that metal embedding member 26 continuously conducts heat into the front cavity 23. Several sound holes 11 corresponding to the sound outlet holes 211 are arranged through on the housing 10, and the front cavity 23 is communicated with the outside through the sound outlet hole 211.

Figure 2:
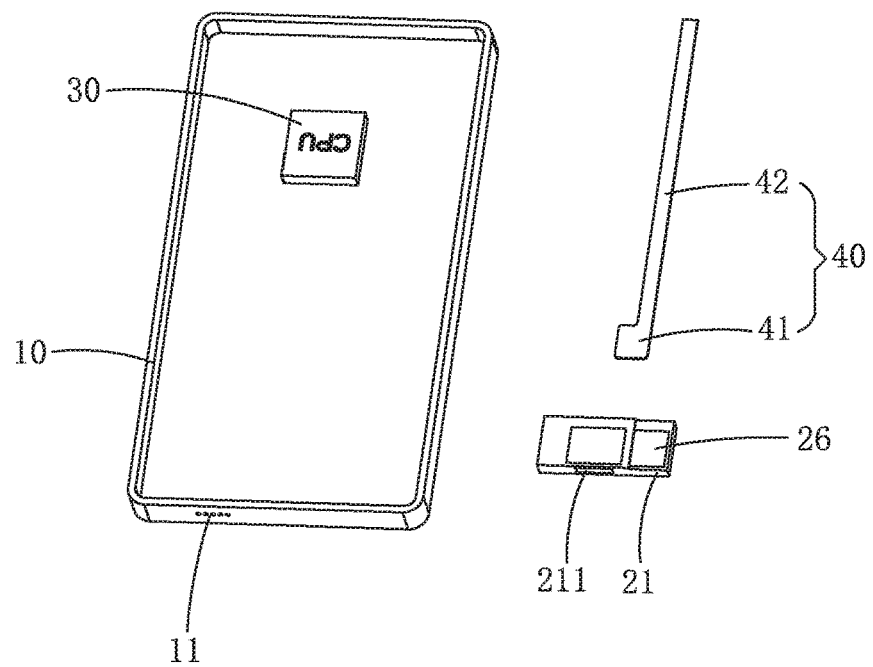
FIG. 2 is an exploded view of the heat dissipation device in FIG. 1.
Figure 3:
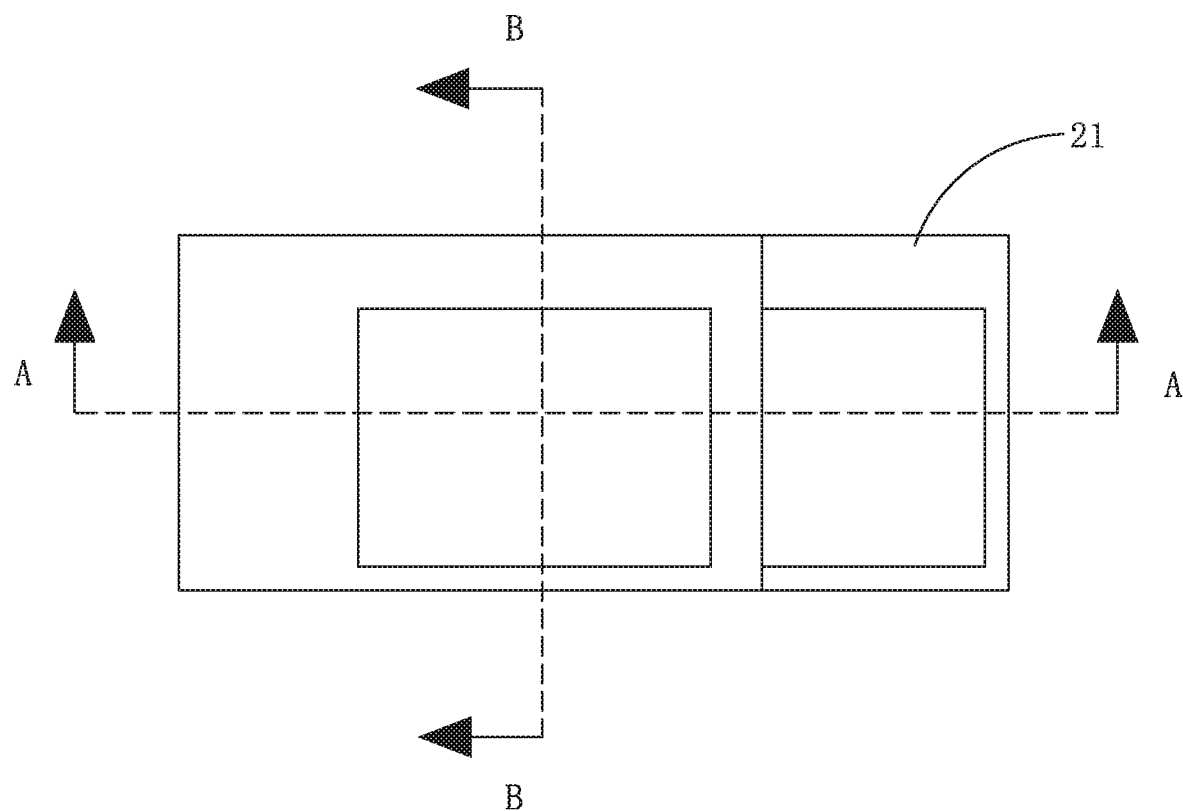
FIG. 3 is a top view of a speaker box of the heat dissipation device provided by the embodiment of the present invention.
Figure 4:
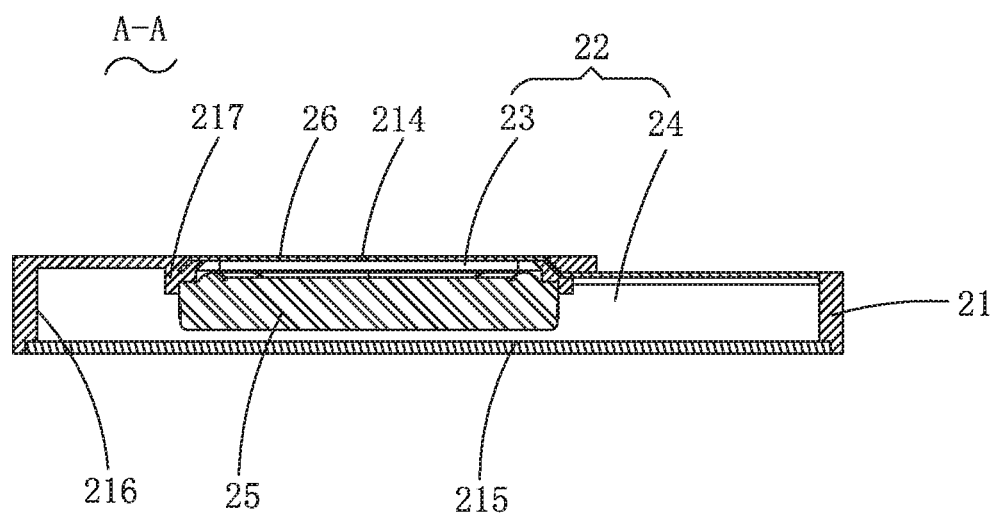
FIG. 4 is a cross-sectional view taken along line A-A in FIG. 3.
Figure 5:
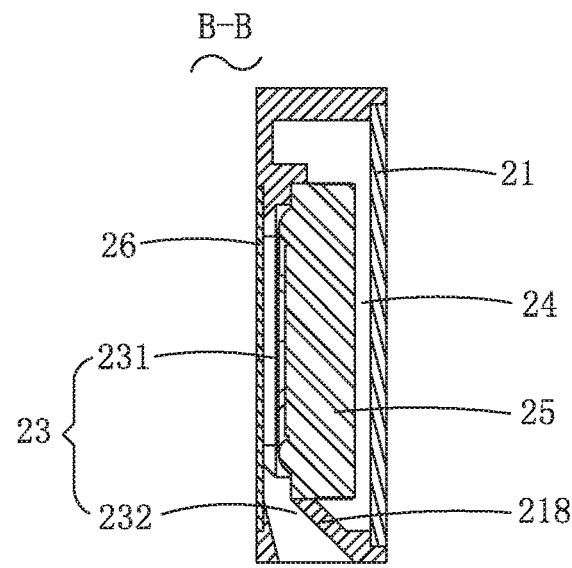
FIG. 5 is a cross-sectional view taken along line B-B in FIG. 3.
Figure 6:
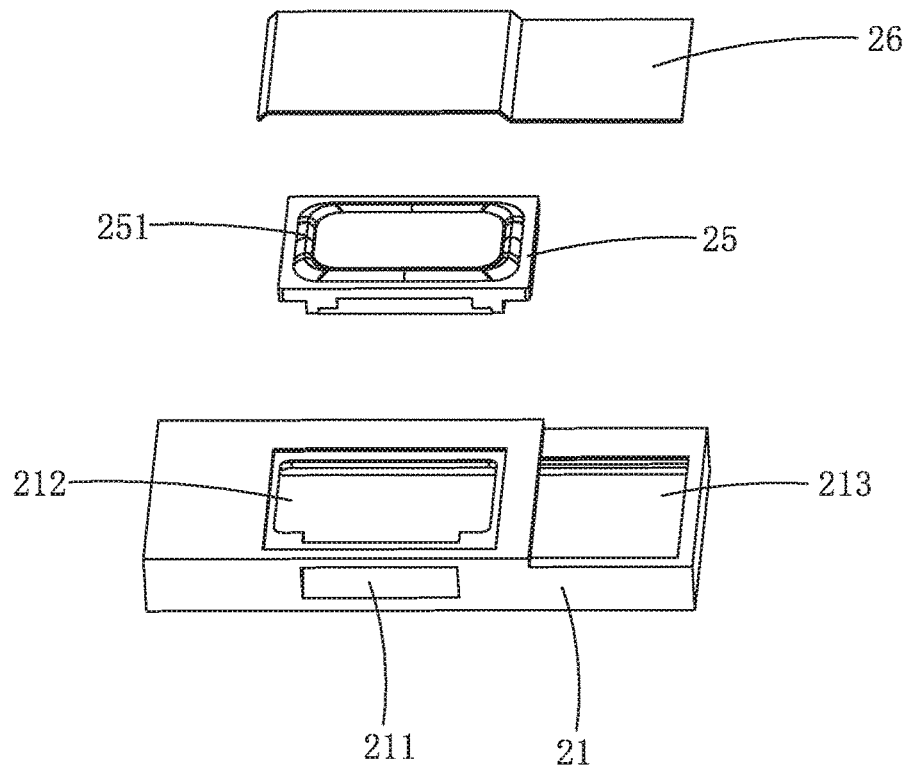
FIG. 6 is an exploded view of the speaker box provided by the embodiment of the present invention.
Figure 7:
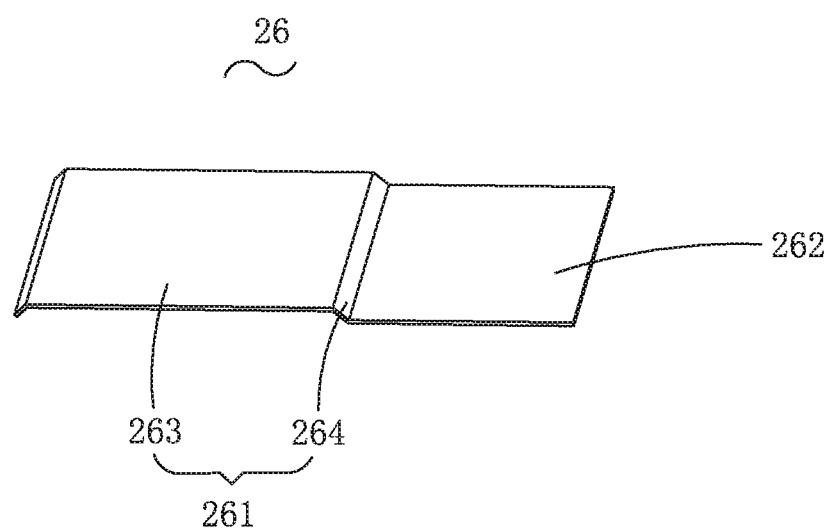
FIG. 7 is an isometric view of a metal embedding member provided by the embodiment of the present invention.

Referring to FIGS. 1 and 2, a first through hole 212 connected to the front cavity 23 and a second through hole 213 connected to the back cavity 24 are provided on the housing 21. The metal embedding member 26 comprises a first reinforcement plate 261 embedded in the housing 21 and covering the first through hole 212 correspondingly, and a second reinforcement plate 262 extending from the first reinforcement plate 261 and covering the second through hole 213; the edges of the metal embedding member 26 are all embedded on the housing 21, preferably, the metal embedding member 26 is plate-shaped and is integrally injection molded with the housing 21; the heat conductor 40 is attached directly to the second reinforcement plate 262 of the metal embedding member 26.

In this embodiment, the heat conductor 40 is connected to the second reinforcement plate 262 at one end, the heat conductor 40 is connected to the heating element 30 at another end. The heat conductor 40 transfers the heat generated by the heating element 30 to the metal embedding member 26, the metal embedding member 26 transfers the heat to the front cavity 23. The diaphragm 251 on the speaker unit 25 can transfer the hot air in the front cavity 23 to the outside of the sound outlet holes 211 via the sound outlet holes 211 and the sound hole 11 for convective heat exchange with the outside air.

The speaker unit 25 in this embodiment can input a pulse signal of lower frequency (less than 1000 Hz) to drive the diaphragm 251 in the speaker unit 25 to vibrate when performing heat dissipation work, pushing the front cavity 23 air flow to form the air cooling effect. The pulse signal can be played separately when the speaker box 20 is not performing a music playing task; the pulse signal may be superimposed into the music signal when performing a music playback task. The signal is an ultra-low frequency pulse signal, which will not be heard by human ears and will not affect the normal listening effect.

In this embodiment, the housing 21 comprises a top wall 214 directly facing and spaced apart from the diaphragm 251, a bottom wall 215 opposite to the top wall 214, the side wall 216 bending and extending from the edge of the top wall 214 toward the bottom wall 215 and a support wall 217 extending from the top wall 214 into the accommodation space 22. The top wall 214, side wall 216 and the bottom wall 215 enclose to form the accommodation space 22. The first through hole 212 and the second through hole 213 are provided spaced apart from each other at the top wall 214. The support wall 217 is provided spaced apart between the front cavity 23 and the back cavity 24, and the speaker unit 25 is fixed to the support wall 217 and spaced from the top wall 214. The diaphragm 251 is located at the top of the speaker unit 25 and opposite to the wall top 214.

As a preferred embodiment, the front cavity 23 comprise a front acoustic cavity 231 and a sound channel 232, the sound outlet holes 211 are formed at the side wall 216, the front acoustic cavity 231 is formed by the spacing between the diaphragm 251 and the top wall 214 directly facing the diaphragm 251. The housing 21 forms a sound channel 232 that connects the front acoustic cavity 231 and the sound outlet hole 211, and the side wall 216 of the housing 21 is attached to the housing 10. Front acoustic cavity 231, sound channel 232, sound outlet hole 211, and sound hole 11 are connected in that order.

As a preferred embodiment, the housing 21 also comprises a separation wall 218 that space sound channel 232 and back cavity 24, The separation wall 218 extends from the side of the speaker unit 25 near the sound outlet hole 211 toward the side wall 216, the separation wall 218, Top wall 214 and side wall 216 enclose sound channel 232.

As a preferred embodiment, the first reinforcement plate 261 comprises a main body part 263 directly facing the diaphragm 251 and a bent part 264 bending from the edges of the main body part 263 toward the bottom wall 215 and embedded in the housing 21. The second reinforcement plate 262 bends and extends from the bent part 264, and at least part of the bent part 264 is embedded in the support wall 217 so as to support the metal embedding member 26. The main body part 263 and the second reinforcement plate 262 are flat plates, and the main body part 263 on the metal embedding member 26, the bent part 264 and the second reinforcement plate 262 are integrally formed, so as to reduce the production cost of the speaker box 20.

In the embodiment, the heat conductor 40 may be a solid heat conductor, and the heat conductor 40 and the metal embedding member 26 may be fixedly connected by welding or gluing; of course, the heat conductor 40 can also be a heat pipe with built-in coolant, and in such case, the heat conductor 40 and the metal embedding member 26 can be fixedly connected by welding.

In the present invention, the heat conductor 40 comprises a contact part 41 stacked on the second reinforcement plate 262 and a connection part 42 extending from one side of the contact part 41 and connected to the heating element 30. The width of the contact part 41 is larger than that of the connection part 42 so as to increase the heat dissipation of the heat conductor 40. Specifically, the front projection of the contact part 41 on the second reinforcement plate 262 covers more than ⅔ of the surface of the second reinforcement plate 262.

The two ends of the heat conductor 40 are defined as an input end and a condensing end respectively. When the heat dissipation device of the present invention is practically used, the input end of the heat conductor 40 in the mobile phone can be tightly attached to the heating element 30 such as the CPU, the condensing end can be tightly attached to the surface of the metal embedding member 26 of the speaker box 20, with the heat entering via the input end. When the heat conductor 40 is a heat conducting tube with a cooling liquid built therein, the cooling liquid at the input end is heated and evaporated, passes through the hollow heat conducting tube and is gradually cooled at a lower-temperature condensing end, and is changed from steam to liquid again, then it flows back to the input end from the heat conduction tube, and repeats this process continuously, so that the heat generated by the heating element 30 is rapidly transferred to the metal embedding member 26, then the metal embedding member 26 conducts the heat into the front cavity 23, and the heat in the heat conductor 40 is rapidly exported to the outside air by utilizing the air cooling effect of the speaker unit 25, so as to achieve the combined effect of liquid cooling and air cooling. It will greatly improve the heat dissipation efficiency, and it can quickly and effectively dissipate heat.

It is to be understood, however, that even though numerous characteristics and advantages of the present exemplary embodiment have been set forth in the foregoing description, together with details of the structures and functions of the embodiment, the disclosure is illustrative only, and changes may be made in detail, especially in matters of shape, size, and arrangement of parts within the principles of the invention to the full extent indicated by the broad general meaning of the terms where the appended claims are expressed.

What is claimed is:

1. A heat dissipation device, comprising:
    a speaker box having a housing having a sound outlet hole, a speaker unit accommodated in the housing and a metal embedding member embedded in the housing;
    a heating element;
    a heat conductor connected between the speaker box and the heating element; wherein
    the housing encloses to form an accommodation space for accommodating the speaker unit;
    the speaker unit comprises a diaphragm dividing the accommodation space into a front cavity communicated with the outside via the sound outlet hole and a back cavity;
    the housing includes a first through hole communicated with the front cavity and a second through hole communicated with the back cavity;
    the metal embedding member comprises a first reinforcement plate embedded in the housing and covering the first through hole correspondingly, and a second reinforcement plate extending from the first reinforcement plate and covering the second through hole, edges of the metal embedding member are all embedded in the housing;
    the heat conductor is connected with the second reinforcement plate at one end, and connected with the heating element at another end;
    the heat conductor transfers the heat generated by the heating element to the metal embedding member, the metal embedding member conducts the heat to the front cavity and out of the sound outlet hole through the air in the front cavity.

2. The heat dissipation device as described in claim 1, wherein the housing comprises a top wall directly facing and spaced from the diaphragm, a bottom wall opposite to the top wall and a side wall bending and extending from the edge of the top wall toward the bottom wall, and the first through hole and the second through hole are arranged spaced apart in the top wall.

3. The heat dissipation device as described in claim 2, wherein the housing further comprises a support wall extending from the top wall to within the accommodation space, the speaker unit is fixed with the support wall and arranged spaced with respect to the top wall, and the support wall is arranged spaced apart between the front cavity and the back cavity.

4. The heat dissipation device as described in claim 3, wherein the sound outlet hole is formed at the side wall, a front acoustic cavity is formed by a spacing between the diaphragm and the top wall directly facing the diaphragm, the housing is formed with a sound channel connecting the front acoustic cavity and the sound outlet hole, and the front cavity comprises the front acoustic cavity and the sound channel.

5. The heat dissipation device as described in claim 4, wherein the housing further comprises a separation wall separating the sound channel from the back cavity, the separation wall extends from a side of the speaker unit near the sound outlet hole toward the side wall; the separation wall, the top wall and the side wall encloses to form the sound channel.

6. The heat dissipation device as described in claim 5, wherein the first reinforcement plate comprises a main body part directly facing the diaphragm and a bent part bent from the edges of the main body part toward the bottom wall and embedded in the housing, the second reinforcement plate bends and extends from the bent part.

7. The heat dissipation device as described in claim 6, wherein at least a portion of the bent part is embedded in the support wall.

8. The heat dissipation device as described in claim 7, wherein the main body part and the second reinforcement plate are both plate-shaped, and the metal embedding member is integrally formed.

9. The heat dissipation device as described in claim 4 further comprising a housing for fixing the speaker box and the heating element, wherein the side wall is attached and fixed correspondingly to the housing, a plurality of sound holes communicated with the sound outlet hole correspondingly is arranged through the housing.

10. The heat dissipation device as described in claim 1, wherein the metal embedding member is plate-shaped and is integrally injection molded with the housing.

11. The heat dissipation device one as described in claim 1, wherein the heat conductor is a solid heat conductor.

12. The heat dissipation device as described in claim 1, wherein the heat conductor is a heat conduct tube having a cooling liquid therein.

13. The heat dissipation device as described in claim 1, wherein the heat conductor comprises a contact part superposed on the second reinforcement plate and a connection part extending from one side of the contact part and connected with the heating element.

14. The heat dissipation device as described in claim 13, wherein the contact part is wider than the connection part.

15. The heat dissipation device as described in claim 14, wherein a front projection of the contact part on the second reinforcement plate covers more than two-thirds of the surface of the second reinforcement plate.

\* \* \* \* \*